(12) United States Patent
Zhang et al.

(10) Patent No.: US 7,153,043 B1
(45) Date of Patent: Dec. 26, 2006

(54) OPTICAL TRANSCEIVER HAVING IMPROVED PRINTED CIRCUIT BOARD

(75) Inventors: Chao Zhang, Chengdu Sichuan Province (CN); Huadong Lei, Chengdu Sichuan Province (CN); Hongbin Wang, Chengdu Sichuan Province (CN)

(73) Assignee: Fiberxon, Inc., Santa Clara, CA (US)

( * ) Notice: Subject to any disclaimer, the term of this patent is extended or adjusted under 35 U.S.C. 154(b) by 0 days.

(21) Appl. No.: 11/336,724

(22) Filed: Jan. 19, 2006

(51) Int. Cl.
*G02B 6/36* (2006.01)

(52) U.S. Cl. ....................................................... 385/92
(58) Field of Classification Search .................. 385/92
See application file for complete search history.

(56) References Cited

U.S. PATENT DOCUMENTS

| | | | |
|---|---|---|---|
| 4,715,928 A * | 12/1987 | Hamby .......................... | 216/18 |
| 5,206,463 A * | 4/1993 | DeMaso et al. .............. | 174/254 |
| 5,588,080 A | 12/1996 | Kawamura | |
| 5,742,480 A * | 4/1998 | Sawada et al. .............. | 361/749 |
| 5,981,043 A * | 11/1999 | Murakami et al. ........... | 428/209 |
| 6,246,009 B1 * | 6/2001 | Millette et al. .............. | 174/254 |
| 6,371,663 B1 | 4/2002 | Kneier | |
| 6,430,053 B1 | 8/2002 | Peterson | |
| 6,687,635 B1 | 2/2004 | Horne | |
| 6,700,654 B1 | 3/2004 | Gerrish | |
| 6,741,622 B1 | 5/2004 | Otsuka | |
| 6,801,454 B1 | 10/2004 | Wang | |
| 6,809,300 B1 | 10/2004 | Wakui | |
| 2002/0093796 A1 | 7/2002 | Medina | |
| 2003/0027440 A1 | 2/2003 | Birch | |
| 2003/0044121 A1 | 3/2003 | Shang | |
| 2003/0049000 A1 | 3/2003 | Wu | |
| 2003/0053762 A1 * | 3/2003 | Cheng et al. ................. | 385/88 |
| 2003/0072137 A1 | 4/2003 | Yen | |
| 2003/0072540 A1 | 4/2003 | Huang | |
| 2003/0075355 A1 * | 4/2003 | Anderson et al. ........... | 174/254 |
| 2003/0156801 A1 | 8/2003 | Hwang | |
| 2003/0194190 A1 | 10/2003 | Huang | |
| 2003/0206403 A1 | 11/2003 | Zaremba | |
| 2003/0214789 A1 | 11/2003 | Medina | |
| 2004/0008954 A1 | 1/2004 | Shaw | |
| 2004/0029417 A1 | 2/2004 | Engel | |
| 2004/0161207 A1 | 8/2004 | Chiu | |

FOREIGN PATENT DOCUMENTS

EP 1067662 10/2001

\* cited by examiner

*Primary Examiner*—Michelle Connelly-Cushwa
*Assistant Examiner*—Chris Chu
(74) *Attorney, Agent, or Firm*—Xin Wen

(57) ABSTRACT

An optical transceiver includes a multi-layer printed circuit board comprising a plurality of layers and a first electric circuit and a flexible printed circuit board comprising a second electric circuit in connection with the first electric circuit. At least one of the layers is a rigid printed circuit board layer. A flexible printed circuit board is an extension of one of the layers in the multi-layer printed circuit board. An electro-optical component in communication with the first electric circuit and the second electric circuit can convert an electric signal to an optical signal or an optical signal to an electric signal.

20 Claims, 4 Drawing Sheets

OPTICAL TRANSCEIVER HAVING IMPROVED PRINTED CIRCUIT BOARD

CROSS-REFERENCES TO RELATED INVENTIONS

The present invention is related to commonly assigned U.S. patent application Ser. No. 10/741,805, titled "Bi-directional optical transceiver module having automatic-restoring unlocking mechanism", filed on Dec. 19, 2003 now abandoned, commonly assigned U.S. patent application Ser. No. 10/815,326, titled "Small form factor pluggable optical transceiver module having automatic-restoring unlocking mechanism and mechanism for locating optical transceiver components", filed on Apr. 1, 2003, commonly assigned U.S. patent application Ser. No. 10/850,216, titled "Optical Transceiver module having improved printed circuit board", filed on May 20, 2004, and commonly assigned Chinese Patent Application No 200520035316.0 titled "Optical Transceiver Circuit Board", filed on Aug. 30, 2005. The disclosures of these related applications are incorporated herein by reference.

TECHNICAL FIELD

This disclosure relates to opto-electrical devices, specifically, optical transceiver modules for telecommunication and data communication applications.

BACKGROUND

Computers are increasingly being connected to other devices and computer networks. Fiber optic lines are commonly used to handle the large amount of data transfer at high data transfer rate. The optic signals carried over the fiber optics must be converted by an optical transceiver to convert the optical light signals to electronic signals to be usable by by a computer. Modern optical transceivers have been modularized with standard physical sizes, under standard electrical interface agreements and standard optical interface agreements. One of such standards agreements is the Small Form-factor Pluggable Multi-Source Agreement (SFP MSA).

Printed Circuit Board (PCB) is an important component in an optical transceiver. A PCB can include transmission and reception circuits that are essential to key functions of the optical transceiver. The increased functionality in data communications requires an increased number of functions to be included on the PCB of an optical transceiver module. On the other hand, the dimensions of optical transceiver modules have become increasingly smaller. It is a challenge for a PCB with decreased interior space to carry more electronic functions. Furthermore, the modular shape and the standard electrical and optical interfaces in optical transceiver module also limit the usable area of the PCB.

One approach to overcome the above problem is to decrease the Integrated Circuit (IC) chip sizes on the PCB by using more advanced IC technologies with deep sub-micron transistors. Another solution is to combine functions previously held on different IC chips into one single IC, making a System-on-a-Chip (SOC) IC. These approaches however rely on the developments of new IC chips. A modern sized SOC chip costs millions of dollars in development, and it usually takes a year or longer to produce such a chip. Thus the SOC approach is expensive and time consuming.

Another approach to overcome the above problem is to increase the usable area of the PCB in the optical transceiver. For example, an extended PCB can be vertically attached to the first PCB, resulting in a combined PCB with a bigger usable area.

It is therefore desirable for a Printed Circuit Board to hold more functions for a fixed working space. Additionally, it is also desirable to make the PCB easier and inexpensive to manufacture and more reliable in use.

SUMMARY

In one general aspect, the present invention relates to an optical transceiver, including a multi-layer printed circuit board comprising a plurality of layers and a first electric circuit, wherein at least one of the layers is a rigid printed circuit board layer; a flexible printed circuit board comprising a second electric circuit in connection with the first electric circuit, wherein the flexible printed circuit board is an extension of one of the layers in the multi-layer printed circuit board, and an electro-optical component in communication with the first electric circuit and the second electric circuit, wherein the electro-optical component is capable of converting a first electric signal to a first optical signal or a second optical signal to a second electric signal.

In another general aspect, the present invention relates to optical transceiver, including a multi-layer printed circuit board comprising a plurality of layers and a first electric circuit, wherein at least one of the layers is a rigid printed circuit board layer; and a flexible printed circuit board comprising a second electric circuit in connection with the first electric circuit, wherein the flexible printed circuit board is an extension of a layer in the multi-layer printed circuit board, wherein at least a portion of the flexible printed circuit board is coated with a material that can control the rigidity of the flexible printed circuit board and provide electromagnetic shield to the flexible printed circuit board; and an electro-optical component in communication with the first electric circuit and the second electric circuit, wherein the electro-optical component is capable of converting a first electric signal to a first optical signal or a second optical signal to a second electric signal.

In yet another general aspect, the present invention relates to an optical transceiver, including a multi-layer printed circuit board comprising a plurality of layers and a first electric circuit, wherein at least one of the layers is a rigid printed circuit board layer; a flexible printed circuit board comprising a second electric circuit in connection with the first electric circuit, wherein the flexible printed circuit board comprises a first extension from a layer in the multi-layer printed circuit board and a second extension from a layer in the multi-layer printed circuit board; and an electro-optical component in communication with the first electric circuit and the second electric circuit, wherein the optical component is capable of converting a first electric signal to a first optical signal or a second optical signal to a second electric signal.

Embodiments may include one or more of the following advantages. The invention system increases the usable space PCB area using a multi-layer PCB board having an extended PCB board, making it possible to pack more functionality into the limited space of an optical transceiver. The increased usable space inside the optical transceiver makes it possible to add more electric functions to the optical transceiver module. For example, it takes more electronic circuits on the PCB to hold functions of transmitting and receiving data at different data rates.

The invention system allows electro-optical components to be connected to PCB without having to bend the electro-optical components' pins. Two primary electro-optical components are an optical to electrical converter, such as a PIN diode, and an electrical to optical converter device, such as a laser diode. Both diodes have dimensions very hard to fit into the limited space of an optical transceiver's sheet metal cover, without having to bend their pins. The elimination of the bending of the pins in the invention system makes the pins less likely to break. The invention system is therefore more robust and reliable than the conventional systems.

At least a portion of the extended PCB board in the invention optical transceiver is flexible and can be folded to accommodate the space in the optical transceiver. The disclosed method and system eliminate soldering or any connectors between an extended PCB board and the main PCB board in the conventional systems. The invention system and methods are thus more reliable, and more time and cost efficient.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
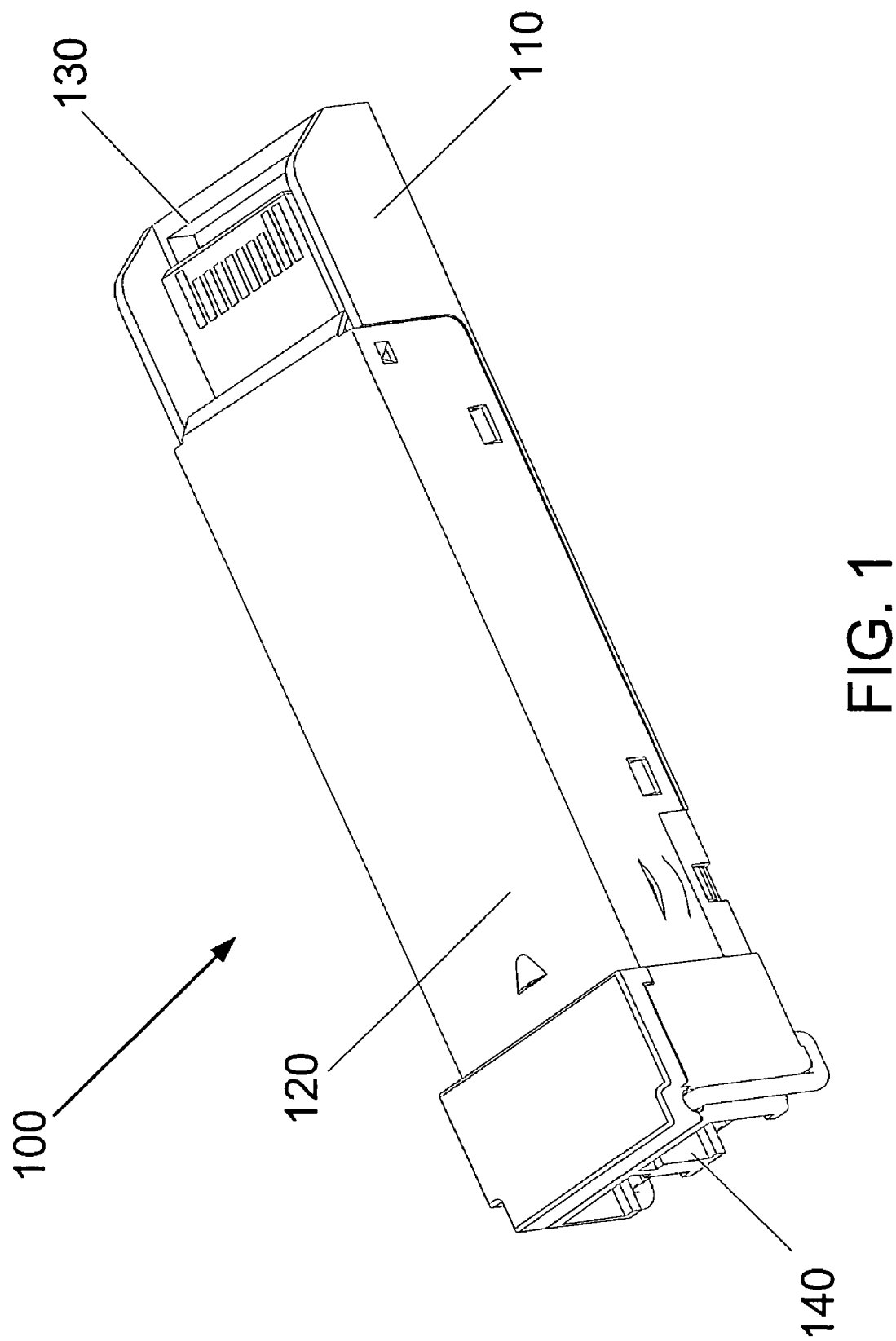
FIG. 1 is a perspective view of the optical transceiver module in accordance with the present invention.
Figure 2:
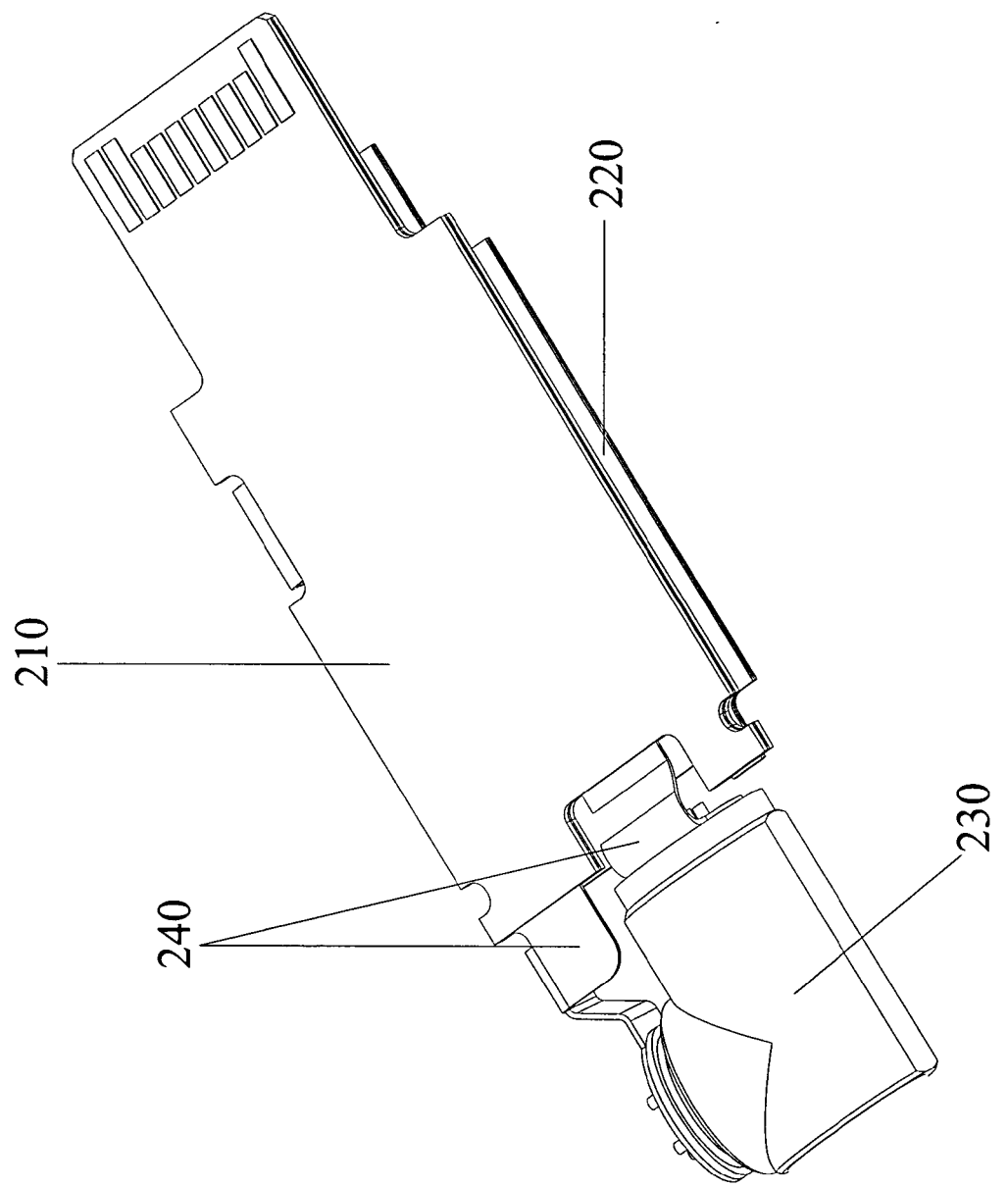
FIG. 2 is a perspective view of a Printed Circuit Board (PCB) having a rigid multi-layer portion and a folded flexible portion.

FIG. 1 is a perspective view of an optical transceiver module 100 comprising a case body 110, a sheet metal cover 120, a first end 130 including an electrical interface and a second end 140 including an optical interface. Under the sheet metal cover 120 of the optical transceiver 100 is a Printed Circuit Board (PCB) 200, as shown in FIG. 2. The PCB 200 contains components for the conversions between optical and electric signals. For example, one or more photo diodes can be held by the PCB 200 to make conversions from optical signals to electronic signals. Multiple Integrated Circuits (IC) can be connected to the PCB 200 to process analog to digital conversion, to provide bias voltages and currencies, and for electrical amplification.

Details of the structures and operations of various components of the optical transceiver module 100 are described in U.S. patent application Ser. No. 10/741,805, filed on Dec. 19, 2003, titled "Bi-directional optical transceiver module having automatic-restoring unlocking mechanism" and commonly assigned U.S. patent application Ser. No. 10/815,326, filed on Apr. 1, 2003, titled "Small form factor pluggable optical transceiver module having automatic-restoring unlocking mechanism and mechanism for locating optical transceiver components". The contents of these patent applications are herein incorporated by reference.

The complexity of the electronic circuits on the PCB 200 has been continuously increased to provide more functionality in the optical transceivers. For example, an optical transceiver can be required to operate at different data rate such as 100 Mb/s and 1 Gb/s. Appropriate control logic is needed to control the optical transceiver 100 to switch between different data rates. The interior space in the transceiver 100 is not expandable since the dimensions of the commercial optical transceivers usually have to conform to an industry standard such as Small Form-factor Pluggable Multi-Source Agreement (SFP MSA). Thus it is necessary to make efforts to increase the usable area of the PCB 200 so that more functions can be added to the optical transceiver.

Figure 3:
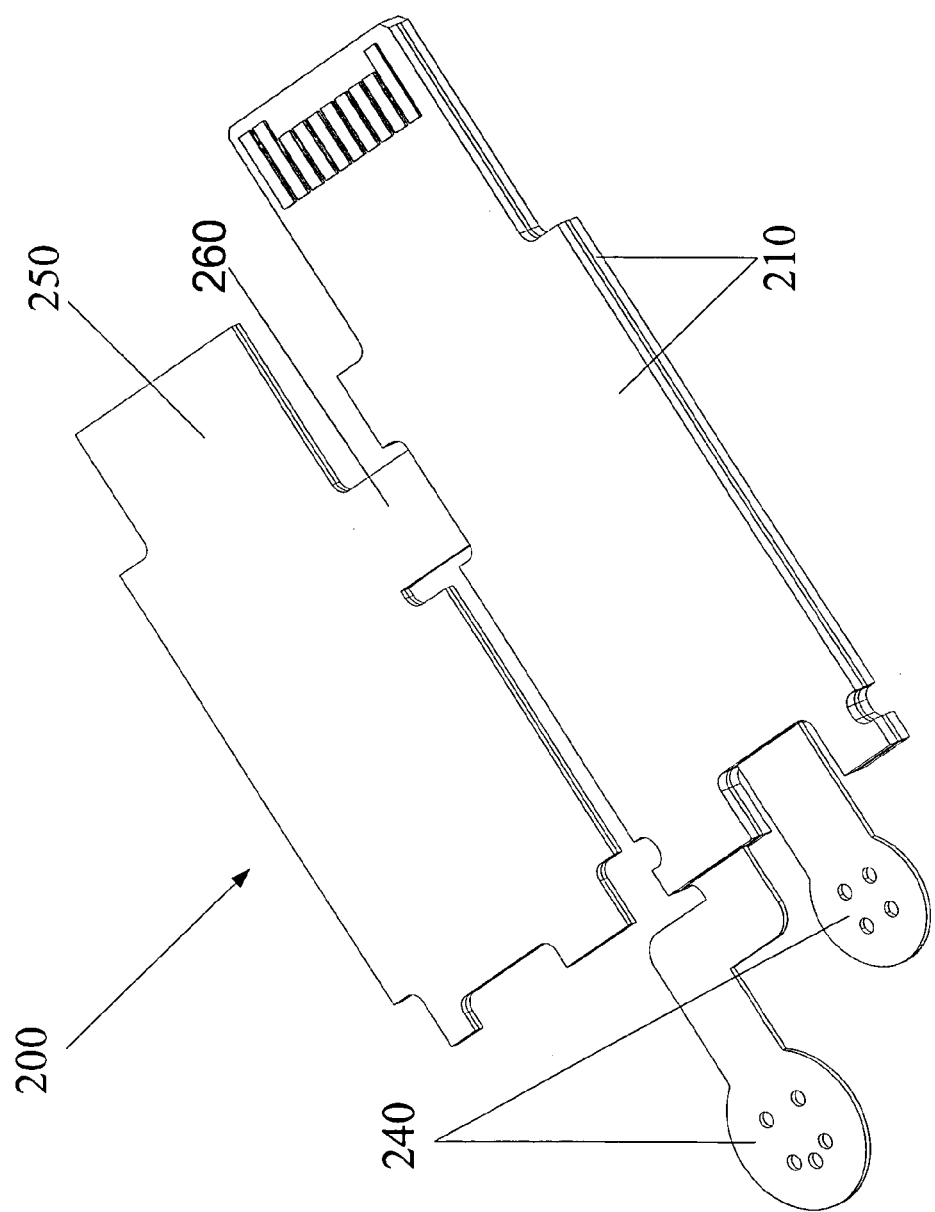
FIG. 3 is a perspective view of the PCB having a rigid multi-layer portion and an unfolded flexible portion.
Figure 4:
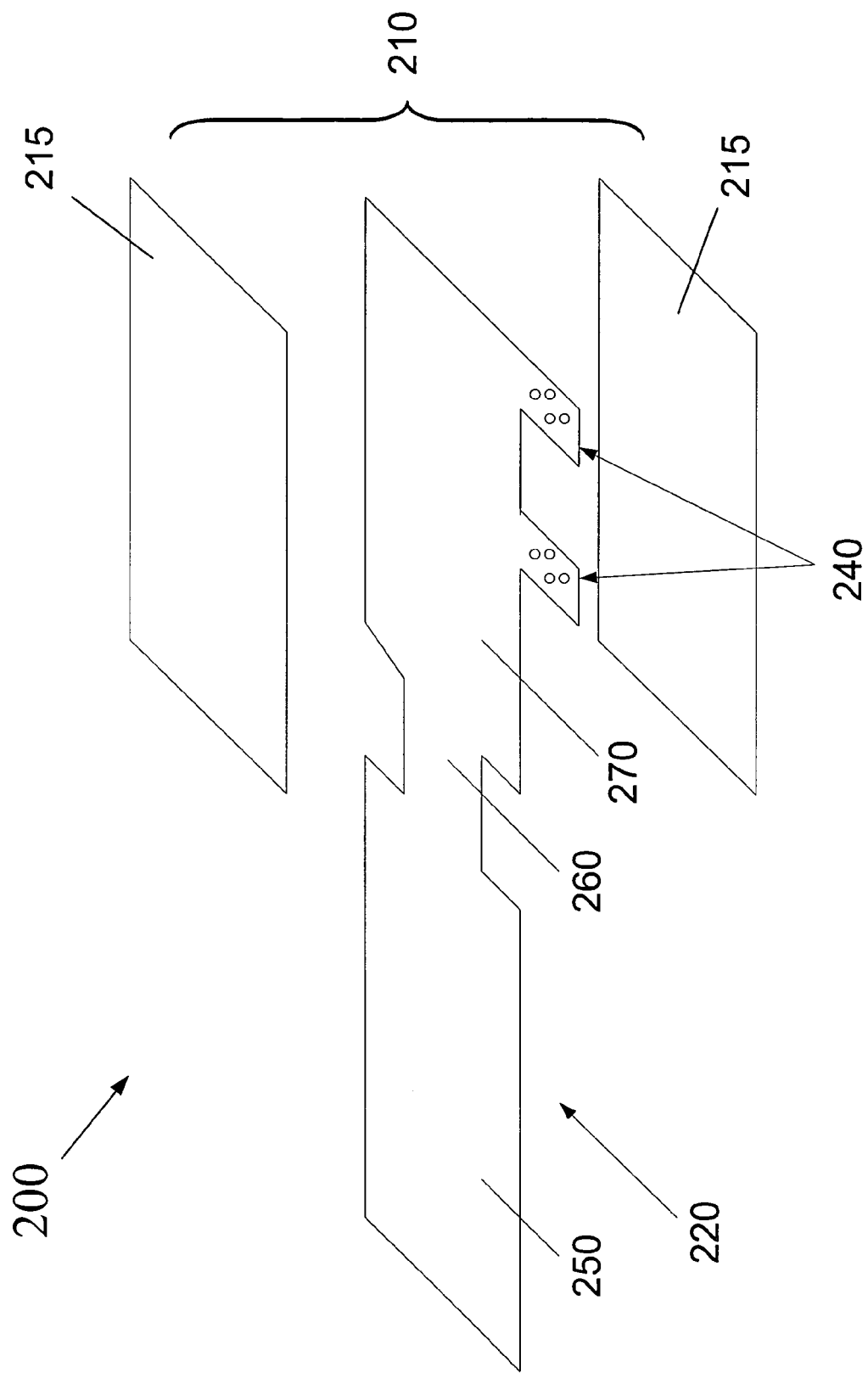
FIG. 4 is an expanded perspective view of the PCB.

FIG. 2 is a perspective view of the structure of the optical transceiver module 100 under the sheet metal cover 120. FIG. 3 is a perspective view of a PCB 200. FIG. 4 illustrates the structure of the combined PCB 200 with a flexible PCB 220. Inside the optical transceiver module 100 are the Printed Circuit Board (PCB) 200, comprised of a multilayer PCB 210, a flexible PCB 220, and an extended portion 240 for connections to one or more electro-optical components. The electro-optical components 230 can include photo diodes for converting optical signals to electric signals and one or more laser diodes for converting electrical signals to optical signals. The multilayer PCB 210 includes a stack of PCB layers including one or more rigid PCB layers 215 and a sandwiched PCB portion 270. The electro-optical components 230 and the electric circuits can be held on either one or more of the rigid PCB layers 215 and the sandwiched PCB portion 270. The rigid PCB layers 215 and the sandwiched PCB portion 270 are interconnected by vias to allow electric and electro-optical components on different layers to communicate with each other. The multilayer PCB 210 can be bonded together by pressing the rigid PCB layers 215 and the sandwiched PCB portion 270 at high temperature and high pressure.

Because of the limited space within the casings of optical transceivers, most conventional electro-optical components have their connection pins bent to fit inside the transceiver casings so that they can be connected with the PCB boards. The bending of the connectors of the electro-optical components creates a reliability issue. The PCB 200 in the invention system includes one or more extended portions 240 connected to the flexible PCB 220. The extended portion 240 includes holes that match the pin layout of the electro-optical components 230. The extended portions 240 are flexible or semi-flexible so that it can be bent to an orientation to allow the pins of the electro-optical components 230 to be plugged vertically into the holes on the extended portion 240 without the bending of the connector pins in the electro-optical components 230. The electro-optical components 230 can subsequently be soldered to the extended portion 240. The extended portions 240 can possess enough rigidity to allow the electro-optical components 230 to be held at fixed positions.

The flexible PCB portion 220 can significantly increase the area of the PCB, allowing more electronic and electro-optical components to be held in the optical transceiver 100. The flexible PCB 220 can be folded by approximately 180 degrees such that another portion of the flexible PCB 220 can be compactly placed substantially facing the multi-layer printed circuit board. The flexible PCB portion 220 is an extended portion of a layer in the stack of PCB layers in the multilayer PCB 210. This configuration eliminates the needs for soldering a secondary PCB to a main PCB in some conventional optical transceivers.

The flexible PCB portion 220 can be bonded to the multilayer PCB 210 during manufacture, as illustrated in FIG. 3 and FIG. 4. The PCB 200 includes a multilayer PCB 210, a flexible PCB 220, and an extended portion 240 of the flexible PCB 220. The flexible PCB 220 is part of the PCB 200. A sandwiched PCB portion 270 of the flexible PCB 220 is one of the layers of the multilayer PCB 200 and is sandwiched between the layers of the multilayer PCB 210. The foldable PCB portion 250 of the flexible PCB 220 is outside the multilayer PCB 210 through a flexible connection portion 260 of the flexible PCB 220. The flexible PCB 220 is made of a single sheet of flexible material board, comprising a foldable PCB portion 250, a flexible connection portion 260, a sandwiched PCB portion 270, and one of more extended portions 240. At least a portion of the flexible PCB 220 is made of a flexible material to allow the flexible PCB 220 to be folded at the flexible portion.

An optional coating can be applied to the foldable PCB portion 250 to increase and optimize the rigidity of the foldable PCB portion 250. Examples of coating materials include RF4 and steel. The flexible connection portion 260 of the flexible PCB 220 can be kept flexible, so that it can bend freely around the edge of the multilayer PCB 210. The flexible connection portion 260 can be kept more rigid to make it easier to hold electric or opto-electrical components. The coating material can be selected to have high electrical conductivity or high magnetic permeability so that the coating can help to shield electromagnetic interference between the electric circuits in the folded flexible PCB 220.

The multilayer PCB 210 includes a stack of PCB layers including one or more rigid PCB layers 215 and a sandwiched PCB portion 270. An electric circuit can be held on the sandwiched PCB portion 270 or on both the sandwiched PCB portion 270 and one or more rigid PCB layers 215. The sandwiched PCB portion 270 is bonded with rigid PCB layers 215 during manufacture. The rigid PCB layers 215 can provide mechanical strengths to the multilayer PCB 210. The foldable PCB portion 250 is connected to the multilayer PCB 210 through the flexible connection portion 260. The flexible connection portion 260 is flexible to be bent along the flexible connection portion 260 approximately 180 degrees such that another portion of the flexible PCB 220 can be placed substantially facing the multi-layer printed circuit board.

The electric circuits on the sandwiched PCB portion 270 can be electrically connected to the rigid layers 215 in the multilayer PCB 210 through via interconnects in the multilayer structure. The foldable PCB portion 250 is electrically connected with the sandwiched PCB portion 270 through electric circuit in the flexible connection portion 260, which in turn is electrically connected with other rigid layers 215 in the multilayer PCB 210 through the vias.

The extended portion 240 can be mounted with electro-optical components 230 such as a diode laser and a photo diode, which avoids the bending with the interconnect pins of the electro-optical components 230. The number and configurations of the extended portion 240 are not limited to the configuration shown in FIG. 4.

The foldable PCB portion 250 can be coated with a hardening material such as FR4 or steel powder to optimize the rigidity of the flexible PCB 220. The coated hardening materials can also shield electromagnetic interference between electronic components and electronic interconnect between the flexible PCB 220 and the rest of the multilayer PCB 210. The PCB 200 can comply with industry standard such as Small Form Factor (SFF) type optical transceiver modules, Small Form-factor Pluggable (SFP) type optical transceiver modules, Bi-directional Small Form-factor Pluggable (Bi-direction SFP) type optical transceiver modules, and other types of optical transceiver modules.

An optical transceiver module having the Printed Circuit Board configuration disclosed in the present invention possesses significant advantages over an optical transceiver module having an ordinary Printed Circuit Board. The more usable area allows an optical transceiver module to hold more functions in the module. It eliminates the use of soldering or any connectors for the connection between the multilayer PCB 210, and the flexible PCB 220, thus greatly improving the reliability of the combined PCB 200. The extended portions 240 of the flexible PCB 220 allow electro-optical components 230 be connected without the bending of the interconnect pins in the electro-optical components 230, thus further increasing the reliability of the optical transceiver 100. The flexible PCB 220 is integrated with the multilayer PCB 210, which is more time and cost efficient. The resulted PCB 200 is more reliable. Finally, the electromagnetic interference between the transmission and reception circuits can be reduced by the coating on the flexible PCB 220.

The configuration of the PCB 200 disclosed in this application provides significant advantages over other combined PCB boards with a secondary flexible extension PCB board. The configuration eliminates the need of soldering or connectors between the multilayer PCB board and the flexible PCB portion or the rigid PCB portion. The combined PCB is thus more reliable compared to the conventional PCB configurations in the optical transceiver devices. Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. An optical transceiver module configured to be connected with an optical fiber aligned in a longitudinal direction, comprising:
    a multi-layer printed circuit board comprising a plurality of layers and a first electric circuit, wherein each of the layers comprises a first side and a second side, the first side being aligned substantially along the longitudinal direction;
    a flexible printed circuit board comprising a second electric circuit in connection with the first electric circuit, wherein the flexible printed circuit board is an extension from the first side of a layer in the multi-layer printed circuit board; and
    an electro-optical component in communication with the first electric circuit and the second electric circuit, wherein the electro-optical component is configured to convert a first electric signal to a first optical signal or a second optical signal to a second electric signal.

2. The optical transceiver module of claim 1, wherein the flexible printed circuit board is connected with a portion of the first side of the layer in the multi-layer printed circuit board.

3. The optical transceiver module of claim 1, wherein the first side is longer than the second side.

4. The optical transceiver module of claim 1, wherein the first electric circuit is located on an outer layer or a middle layer in the plurality of layers of the multi-layer printed circuit board.

5. The optical transceiver module of claim 1, wherein the flexible printed circuit board is an extension of a middle layer in the plurality of layers of the multi-layer printed circuit.

6. The optical transceiver module of claim 1, wherein the flexible printed circuit board comprises a foldable portion adjacent to the first side of the layer in the multi-layer printed circuit board.

7. The optical transceiver module of claim 6, wherein the flexible printed circuit board further comprises a second portion in connection with the foldable portion, wherein the second portion is configured to be positioned substantially vertical to or facing the multi-layer printed circuit board when the flexible printed circuit board is folded at the foldable portion.

8. The optical transceiver module of claim 7, wherein the second portion of the flexible printed circuit board comprises substantially the same dimensions as the multi-layer printed circuit board.

9. The optical transceiver module of claim 1, further comprising an electrical interface in electric connection with the first electric circuit, configured to receive the first electric signal and output the second electric signal.

10. The optical transceiver module of claim 1, wherein the first side is substantially perpendicular to the second side.

11. The optical transceiver module of claim 1, wherein at least a portion of the flexible printed circuit board is coated with a material that can control the rigidity of the flexible printed circuit board and provide electromagnetic shield to the flexible printed circuit board.

12. The optical transceiver module of claim 1, wherein one of the layers in the multi-layer printed circuit board comprises an extended portion outside the second side of the multi-layer printed circuit board, wherein the extended portion is configured to be connected with one or more electro-optical components.

13. The optical transceiver module of claim 12, wherein the extended portion is flexible or semi-flexible.

14. The optical transceiver module of claim 12, wherein the extended portion is connected with same layer in multi-layer printed circuit that the flexible printed circuit is an extension of.

15. An optical transceiver module configured to be connected with an optical fiber aligned in a longitudinal direction, comprising:
a multi-layer printed circuit board comprising a plurality of layers and a first electric circuit, wherein each of the layers comprises a first side and a second side, the first side being aligned substantially along the longitudinal direction;
a flexible printed circuit board comprising a second electric circuit in connection with the first electric circuit, wherein the flexible printed circuit board is an extension from the first side of a layer in the multi-layer printed circuit board;
an electromagnetic shielding material on at least a portion of the flexible printed circuit board; and
an electro-optical component in communication with the first electric circuit and the second electric circuit, wherein the electro-optical component is configured to convert a first electric signal to a first optical signal or a second optical signal to a second electric signal.

16. The optical transceiver module of claim 15, wherein the flexible printed circuit board comprises a foldable portion adjacent to the first side of the layer in the multi-layer printed circuit board.

17. The optical transceiver module of claim 16 wherein the flexible printed circuit board further comprises a second portion in connection with the foldable portion, wherein the second portion is configured to be positioned substantially vertical to or facing the multi-layer printed circuit board when the flexible printed circuit board is folded at the foldable portion.

18. The optical transceiver module of claim 15, wherein one of the layers in the multi-layer printed circuit board comprises an extended portion outside the second side of the multi-layer printed circuit board, wherein the extended portion is configured to be connected with one or more electro-optical components.

19. The optical transceiver module of claim 18, wherein the extended portion is connected with same layer in multi-layer printed circuit that the flexible printed circuit is an extension of.

20. An optical transceiver module configured to be connected with an optical fiber aligned in a longitudinal direction, comprising:
a multi-layer printed circuit board comprising a plurality of layers and a first electric circuit, wherein each of the layers comprises a first side and a second side, the first side being aligned substantially along the longitudinal direction;
a flexible printed circuit board comprising a first portion extended from the first side of a layer in the multi-layer printed circuit board and a second portion extended from the second side of the layer in the multi-layer printed circuit board, wherein the flexible printed circuit board comprises a second electric circuit in connection with the first electric circuit; and
an electro-optical component in communication with the first electric circuit and the second electric circuit, wherein the electro-optical component is capable of converting a first electric signal to a first optical signal or a second optical signal to a second electric signal.

* * * * *